(12) United States Patent
Nishioka

(10) Patent No.: US 9,285,665 B2
(45) Date of Patent: Mar. 15, 2016

(54) SEMICONDUCTOR LIGHT-EMITTING DEVICE, SUPER LUMINESCENT DIODE, AND PROJECTOR

(71) Applicant: Seiko Epson Corporation, Tokyo (JP)

(72) Inventor: Hiroki Nishioka, Chino (JP)

(73) Assignee: Seiko Epson Corporation (JP)

( * ) Notice: Subject to any disclaimer, the term of this patent is extended or adjusted under 35 U.S.C. 154(b) by 197 days.

(21) Appl. No.: 14/190,504

(22) Filed: Feb. 26, 2014

(65) Prior Publication Data

US 2014/0240682 A1    Aug. 28, 2014

(30) Foreign Application Priority Data

Feb. 27, 2013    (JP) .................... 2013-036771

(51) Int. Cl.

| | |
|---|---|
| *G03B 21/20* | (2006.01) |
| *H01L 33/00* | (2010.01) |
| *H01L 33/08* | (2010.01) |
| *G03B 33/06* | (2006.01) |
| *H01L 33/10* | (2010.01) |

(52) U.S. Cl.

CPC .......... *G03B 21/2033* (2013.01); *G03B 21/208* (2013.01); *G03B 21/2013* (2013.01); *G03B 33/06* (2013.01); *H01L 33/0045* (2013.01); *H01L 33/08* (2013.01); *H01L 33/10* (2013.01)

(58) Field of Classification Search

CPC ............... G03B 21/2033; G03B 21/20; H01L 33/0045; H01L 33/08; H01L 33/20; H01L 33/24

USPC ........................................................ 257/98

See application file for complete search history.

(56) References Cited

U.S. PATENT DOCUMENTS

| | | | |
|---|---|---|---|
| 2002/0131465 A1* | 9/2002 | Lo .................. | H01S 5/0265 372/50.21 |
| 2005/0185881 A1* | 8/2005 | Murata ............. | G02B 6/4214 385/15 |
| 2013/0242310 A1* | 9/2013 | Matsuu ............ | H01L 33/0045 356/479 |
| 2013/0292723 A1 | 11/2013 | Ohno | |
| 2014/0092391 A1* | 4/2014 | Matsuu ............. | H05B 37/02 356/479 |

FOREIGN PATENT DOCUMENTS

| | | |
|---|---|---|
| JP | 2011-155103 A | 8/2011 |
| JP | 2012-043950 A | 3/2012 |

* cited by examiner

*Primary Examiner* — William C Dowling
*Assistant Examiner* — Ryan Howard
(74) *Attorney, Agent, or Firm* — Harness, Dickey & Pierce, P.L.C.

(57) ABSTRACT

A semiconductor light-emitting device includes: a stacked structure including a light-emitting layer, a first cladding layer, and a second cladding layer; a first electrode electrically connected with the first cladding layer; a second electrode electrically connected with the second cladding layer; and a third electrode electrically connected with the second cladding layer. The stacked structure includes an optical waveguide. The optical waveguide includes a straight waveguide portion extending from a light exiting portion along a straight line inclined to a normal of a front edge surface of the stacked structure, and a curved waveguide portion including a curved waveguide having a shape with a curvature. The density of current injected into the straight waveguide portion is higher than that of current injected into the curved waveguide portion.

16 Claims, 13 Drawing Sheets

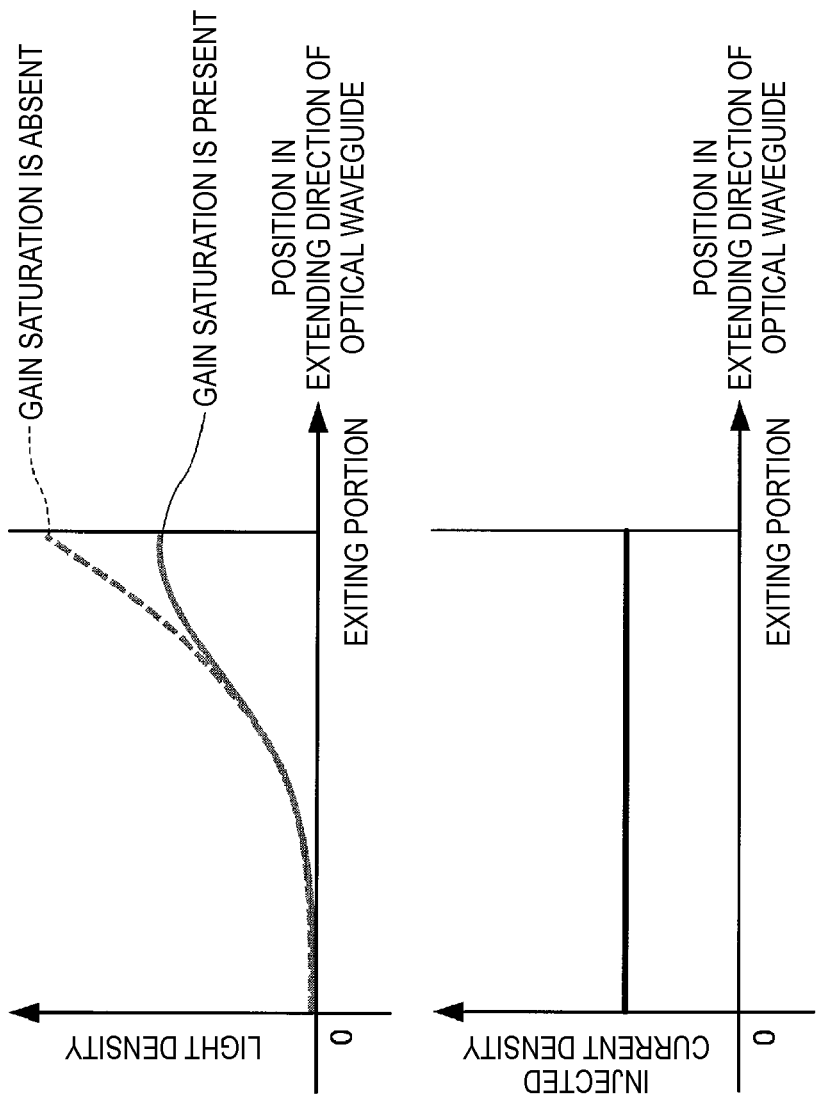

SEMICONDUCTOR LIGHT-EMITTING DEVICE, SUPER LUMINESCENT DIODE, AND PROJECTOR

BACKGROUND

1. Technical Field

The present invention relates to a semiconductor light-emitting device, a super luminescent diode, and a projector.

2. Related Art

A super luminescent diode (hereinafter also referred to as "SLD") is a semiconductor light-emitting device that can provide an output up to about several hundreds of mW with a single device in optical output characteristics similarly to a semiconductor laser while exhibiting incoherent properties and a wideband spectrum shape similarly to an ordinary light-emitting diode.

The SLD is used as, for example, a light source of a projector. For realizing a small and high-luminance projector, it is necessary to improve the luminous efficiency of the light source, reduce loss in an optical system, and reduce the number of components. With the use of the SLD as a light source, a dichroic mirror necessary for a color separation optical system and a rotating diffuser necessary for securing the safety of a semiconductor laser and reducing speckle noise can be eliminated.

For example, JP-A-2012-43950 discloses an SLD including an optical waveguide including a straight waveguide portion and a curved waveguide portion.

In the SLD described above, however, light guided in an active layer is exponentially amplified toward a light exiting portion side (low reflectance side). Therefore, the number of carriers becomes insufficient relative to light on the light exiting portion side. Due to this, gain saturation occurs, so that light output is reduced in some cases.

SUMMARY

An advantage of some aspects of the invention is to provide a semiconductor light-emitting device that can suppress a reduction in light output due to gain saturation. Another advantage of some aspects of the invention is to provide a projector including the semiconductor light-emitting device.

A semiconductor light-emitting device according to an aspect of the invention includes: a stacked structure including a light-emitting layer, a first cladding layer, and a second cladding layer, the first cladding layer and the second cladding layer interposing the light-emitting layer therebetween; a first electrode electrically connected with the first cladding layer; a second electrode electrically connected with the second cladding layer; and a third electrode electrically connected with the second cladding layer and arranged at a position different from that at which the second electrode is arranged, wherein the stacked structure includes an optical waveguide, the optical waveguide includes a straight waveguide portion extending from a light exiting portion along a straight line inclined to a normal of a front edge surface of the stacked structure, the light exiting portion being disposed on the front edge surface of the stacked structure, and a curved waveguide portion continuous with the straight waveguide portion and including a curved waveguide having a shape with a curvature, and the density of current injected into the straight waveguide portion located between the first electrode and the second electrode is higher than that of current injected into the curved waveguide portion located between the first electrode and the third electrode.

According to the semiconductor light-emitting device, a reduction in light output due to gain saturation can be suppressed. Further, according to the semiconductor light-emitting device, the formation of a direct resonator can be prevented, so that laser oscillation of light generated in the optical waveguide can be suppressed. Accordingly, speckle noise can be reduced.

It is noted that, in the descriptions concerning the invention, the phrase "electrically connect" or "electrically connected" may be used, for example, in a manner as "a specific member (hereinafter referred to as "A member") "electrically connected" to another specific member (hereinafter referred to as "B member". In the descriptions concerning the invention, in the case of such an example, the phrase "electrically connect" or "electrically connected" is used, while assuming that it includes the case where A member and B member are electrically connected in direct contact with each other, and the case where A member and B member are electrically connected via another member.

In the semiconductor light-emitting device according to the aspect of the invention, the density of current injected into the straight waveguide portion located between the first electrode and the second electrode may be higher than that of current injected into the straight waveguide portion located between the first electrode and the third electrode.

According to the semiconductor light-emitting device with this configuration, a reduction in light output due to gain saturation can be suppressed.

In the semiconductor light-emitting device according to the aspect of the invention, the optical waveguide may be disposed so as to extend from the front edge surface to a rear edge surface of the stacked structure.

According to the semiconductor light-emitting device with this configuration, a reduction in light output due to gain saturation can be suppressed.

In the semiconductor light-emitting device according to the aspect of the invention, the curved waveguide portion may perpendicularly reach the rear edge surface of the stacked structure.

According to the semiconductor light-emitting device with this configuration, light loss at a reflecting portion disposed on the rear edge surface can be reduced.

In the semiconductor light-emitting device according to the aspect of the invention, the curved waveguide portion may be formed closer to the rear edge surface side of the stacked structure than the center of the optical waveguide.

According to the semiconductor light-emitting device with this configuration, light loss in the curved waveguide portion can be reduced.

In the semiconductor light-emitting device according to the aspect of the invention, a high-reflectance film in which a plurality of dielectric films are stacked may be formed on the rear edge surface of the stacked structure.

According to the semiconductor light-emitting device with this configuration, in a wavelength band of light generated in the optical waveguide, the reflectance of the rear edge surface can be made high, so that the semiconductor light-emitting device can include a reflecting portion with a little light loss.

In the semiconductor light-emitting device according to the aspect of the invention, an extremely-low-reflectance film as a single layer or multiple layers of dielectric films may be formed on the front edge surface of the stacked structure.

According to the semiconductor light-emitting device with this configuration, in the wavelength band of the light generated in the optical waveguide, the reflectance of the front edge surface can be made low, so that the semiconductor light-emitting device can include a light exiting portion with a little light loss. Further, according to the semiconductor light-emitting device, the formation of a direct resonator can be prevented, so that laser oscillation of the light generated in the optical waveguide can be suppressed.

A projector according to another aspect of the invention includes: the semiconductor light-emitting device according to the aspect of the invention; a light modulation device modulating, according to image information, light emitted from the semiconductor light-emitting device; and a projection device projecting an image formed by the light modulation device.

According to the projector, it is possible to include the semiconductor light-emitting device that can suppress a reduction in light output due to gain saturation.

A super luminescent diode according to still another aspect of the invention includes: a straight waveguide linearly extending from a light exiting portion; and a curved waveguide continuous with the straight waveguide and having a shape with a curvature, wherein the density of current injected into the straight waveguide is higher than that of current injected into the curved waveguide.

According to the super luminescent diode, a reduction in light output due to gain saturation can be suppressed.

A projector according to yet another aspect of the invention includes: the super luminescent diode according to the aspect of the invention; a light modulation device modulating, according to image information, light emitted from the super luminescent diode; and a projection device projecting an image formed by the light modulation device.

According to the projector, it is possible to include the super luminescent diode that can suppress a reduction in light output due to gain saturation.

BRIEF DESCRIPTION OF THE DRAWINGS

The invention will be described with reference to the accompanying drawings, wherein like numbers reference like elements.

FIGS. 4A and 4B are graphs each schematically showing the relation between the position in an extending direction of an optical waveguide and the light density or the injected current density.

DESCRIPTION OF EXEMPLARY EMBODIMENTS

Hereinafter, preferred embodiments of the invention will be described in detail with reference to the drawings. The embodiments described below do not unduly limit the contents of the invention set forth in the appended claims. Moreover, not all of the configurations described below are essential elements.

1. First Embodiment 1.1. Semiconductor Light-Emitting Device

Figure 1:
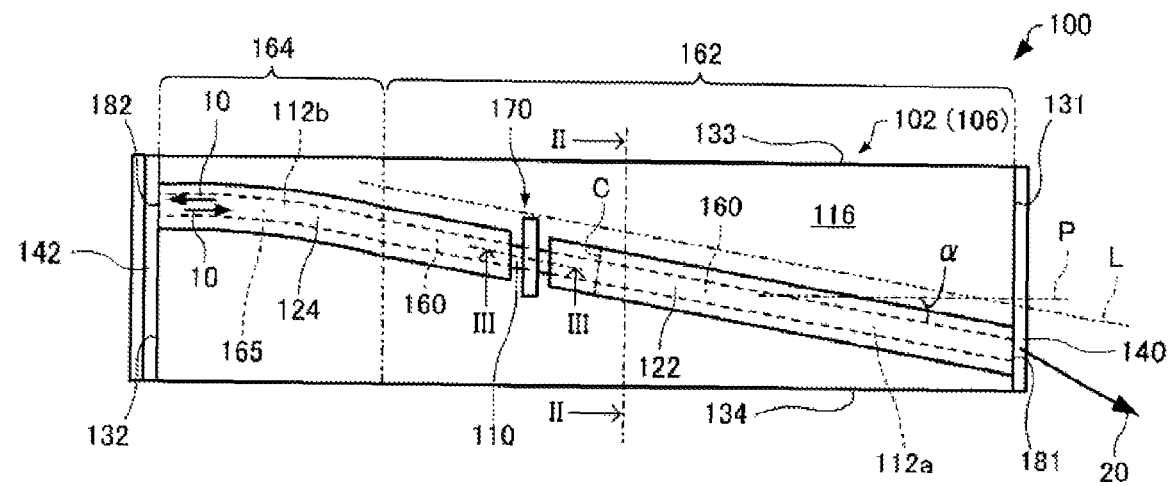
FIG. 1 is a plan view schematically showing a semiconductor light-emitting device according to a first embodiment.
Figure 2:
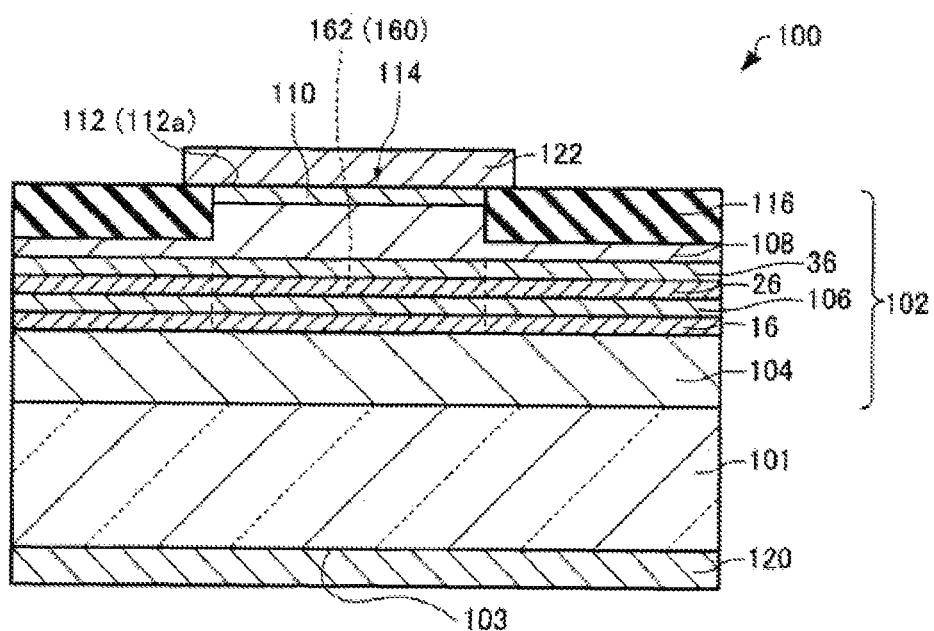
FIG. 2 is a cross-sectional view schematically showing the semiconductor light-emitting device according to the first embodiment.
Figure 3:
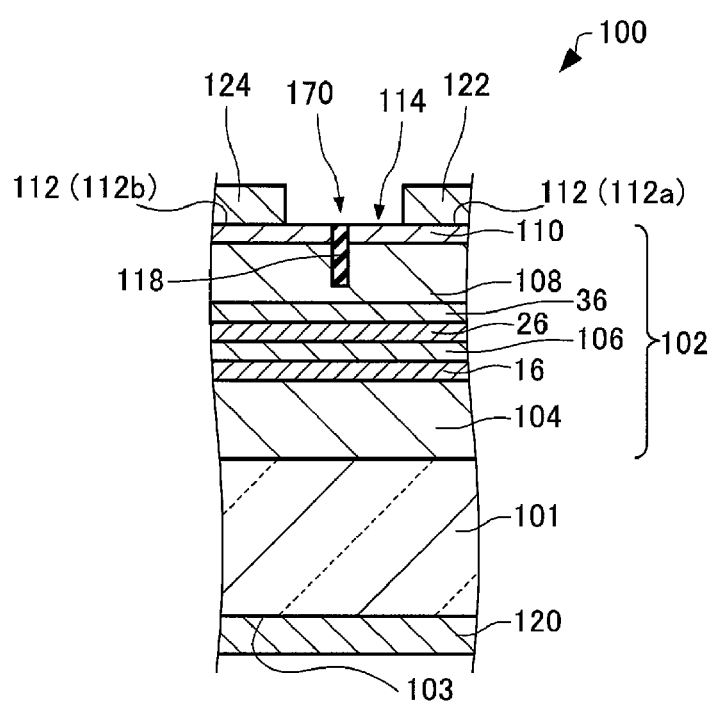
FIG. 3 is a cross-sectional view schematically showing the semiconductor light-emitting device according to the first embodiment.

First, a semiconductor light-emitting device according to a first embodiment will be described with reference to the drawings. FIG. 1 is a plan view schematically showing a semiconductor light-emitting device 100 according to the first embodiment. FIG. 2 is a cross-sectional view taken along line II-II in FIG. 1, schematically showing the semiconductor light-emitting device 100 according to the first embodiment. FIG. 3 is a cross-sectional view taken along line III-III in FIG. 1, schematically showing the semiconductor light-emitting device 100 according to the first embodiment.

Hereinafter, the semiconductor light-emitting device 100 will be described in which the semiconductor light-emitting device 100 is an SLD formed using nitride semiconductor and outputting blue light at a wavelength of 450 nm. In the SLD, unlike a semiconductor laser, laser oscillation can be prevented by suppressing the formation of a resonator due to edge reflection. Therefore, speckle noise can be reduced.

As shown in FIGS. 1 to 3, the semiconductor light-emitting device 100 includes a stacked structure 102, a first electrode 120, a second electrode 122, and a third electrode 124. Further, the semiconductor light-emitting device 100 can include a substrate 101, insulating layers 116 and 118, an extremely-low-reflectance film 140, and a high-reflectance film 142.

The substrate 101 is, for example, a GaN substrate of first conductivity type (for example, n type). In the illustrated example, the planar shape (shape as viewed from a stacked direction of the stacked structure 102) of the substrate 101 is rectangular.

The stacked structure 102 is formed on the substrate 101. In the example shown in FIG. 1, the planar shape of the stacked structure 102 is rectangular. The stacked structure 102 includes a front edge surface 131, a rear edge surface 132, and side edge surfaces 133 and 134. In surfaces of the stacked structure 102, the edge surfaces 131 to 134 are surfaces that are not in contact with the substrate 101, the second electrode 122, and the third electrode 124 in a planar manner. The edge surfaces 131 to 134 are, for example, flat surfaces. The edge surfaces 131 to 134 may be cleaved surfaces formed by cleavage. The front edge surface 131 and the rear edge surface 132 face each other. The side edge surfaces 133 and 134 face each other and are connected to the front edge surface 131 and the rear edge surface 132.

On the front edge surface 131 of the stacked structure 102, the extremely-low-reflectance film 140 as a single layer or multiple layers of dielectric films is formed. On the rear edge surface 132 of the stacked structure 102, the high-reflectance film 142 in which multiple layers of dielectric films are stacked is formed. With this configuration, in a wavelength band of light generated in an active layer 106 (in an optical waveguide 160), the reflectance of the rear edge surface 132 can be made higher than that of the front edge surface 131. The reflectance of the front edge surface 131 is desirably 0% or close to 0%. The reflectance of the rear edge surface 132 is desirably 100% or close to 100%. As the extremely-low-reflectance film 140 and the high-reflectance film 142, for example, a $SiO_2$ layer, a $Ta_2O_5$ layer, an $Al_2O_3$ layer, a TiN layer, a $TiO_2$ layer, a SiON layer, a SiN layer, or a multilayer film of them is used.

The stacked structure 102 is formed of a plurality of semiconductor layers including the active layer 106 as a light-emitting layer, and a first cladding layer 104 and a second cladding layer 108 interposing the light-emitting layer therebetween. More specifically, the stacked structure 102 is composed of the first cladding layer 104, a first guide layer 16, the active layer 106, a second guide layer 26, a carrier overflow suppression (OFS) layer 36, the second cladding layer 108, and a contact layer 110. The stacked structure 102 includes the optical waveguide 160.

The first cladding layer 104 is formed on the substrate 101. The first cladding layer 104 is, for example, an n-type AlGaN layer. Although not illustrated, a buffer layer may be formed between the substrate 101 and the first cladding layer 104. The buffer layer is, for example, an n-type GaN layer. The buffer layer can improve the crystallinity of a layer formed thereon.

The first guide layer 16 is formed on the first cladding layer 104. The first guide layer 16 is, for example, an n-type GaN layer. The first guide layer 16 can guide light generated in the active layer 106.

The active layer 106 is formed on the first guide layer 16. The active layer 106 has, for example, a multi-quantum well (MQW) structure in which three quantum well structures composed of InGaN well layers and InGaN barrier layers are stacked.

A portion of the active layer 106 constitutes the optical waveguide 160. Specifically, the optical waveguide 160 is composed of portions of the first cladding layer 104, the first guide layer 16, the active layer 106, the second guide layer 26, the OFS layer 36, and the second cladding layer 108.

The optical waveguide 160 can guide light. In the illustrated example, the optical waveguide 160 includes portions that overlap electrodes 122 and 124, in plan view, and a portion that does not overlap the electrodes 122 and 124. The portions of the optical waveguide 160 overlapping the electrodes 122 and 124 are portions into which current is injected through the electrode 120 and the electrodes 122 and 124.

The portions of the optical waveguide 160 into which current is injected can generate light. The light that is guided in the optical waveguide 160 can receive a gain in the portions of the optical waveguide 160 into which current is injected. Specifically, the portions of the optical waveguide 160 into which current is injected are portions located between a contact plane 103 between the substrate 101 and the first electrode 120 and contact planes 112a and 112b between the contact layer 110 and the electrodes 122 and 124.

The optical waveguide 160 is disposed so as to extend from the front edge surface 131 to the rear edge surface 132 of the stacked structure 102. The optical waveguide 160 includes a straight waveguide portion 162 and a curved waveguide portion 164.

The straight waveguide portion 162 extends from the front edge surface 131 to the curved waveguide portion 164. The straight waveguide portion 162 has a predetermined width as viewed from the stacked direction of the stacked structure 102 (hereinafter also referred to as "in plan view"), and has a belt-like linear longitudinal shape along an extending direction of the straight waveguide portion 162. The straight waveguide portion 162 includes a first end surface 181 disposed at a portion connecting with the front edge surface 131. The first end surface 181 can function as a light exiting portion through which the light guided in the optical waveguide 160 exits. That is, the straight waveguide portion 162 linearly extends from the light exiting portion 181 disposed on the front edge surface 131 to the curved waveguide portion 164. The first end surface 181 is covered with the extremely-low-reflectance film 140.

The extending direction of the straight waveguide portion 162 is, for example, an extending direction of a straight line passing the center of the first end surface 181 and the center of a connecting plane between the straight waveguide portion 162 and the curved waveguide portion 164 in plan view. Moreover, the extending direction of the straight waveguide portion 162 may be an extending direction of a border line of the straight waveguide portion 162 (a border line between the straight waveguide portion 162 and a portion excluding the straight waveguide portion 162).

The straight waveguide portion 162 is disposed, in plan view, along a straight line (imaginary straight line) L relative to a normal P of the front edge surface 131. In the illustrated example, the straight waveguide portion 162 is inclined at an angle α to the normal P and connected with the front edge surface 131. In other words, it can be said that the extending direction of the straight waveguide portion 162 has the angle α relative to the normal P. The angle α is an acute angle greater than 0° and an angle smaller than a critical angle.

The curved waveguide portion 164 is continuous with the straight waveguide portion 162. The curved waveguide portion 164 extends from the straight waveguide portion 162 to the rear edge surface 132. The curved waveguide portion 164 has, in plan view, a predetermined width and includes a curved waveguide 165 having a shape with a curvature along an extending direction of the curved waveguide portion 164. For example, the whole of the curved waveguide portion 164 may be the curved waveguide 165. That is, the curved waveguide portion 164 may be composed of the curved waveguide 165. The curved waveguide portion 164 includes a second end surface 182 disposed at a portion connecting with the rear edge surface 132. The second end surface 182 can function as a reflecting portion that reflects light guided in the optical waveguide 160. That is, the curved waveguide portion 164 extends from the straight waveguide portion 162 to the reflecting portion 182 disposed on the rear edge surface 132. The second end surface 182 is covered with the high-reflectance film 142.

The extending direction of the curved waveguide portion 164 may be an extending direction of a border line of the curved waveguide portion 164 (a border line between the curved waveguide portion 164 and a portion excluding the curved waveguide portion 164). The optical waveguide 160 may have a constant width (size in a direction orthogonal to the extending direction) from the front edge surface 131 to the rear edge surface 132.

The radius of curvature of the curved waveguide 165 is not particularly limited, and is, for example, 1 mm or more. With this configuration, light loss in the curved waveguide 165 can be reduced. The entire length (length in the extending direction) of the optical waveguide 160 is not particularly limited, and is, for example, about 1.5 mm.

The curved waveguide portion 164 perpendicularly reaches (connects with) the rear edge surface 132 in plan view. The curved waveguide portion 164 is formed closer to the rear edge surface 132 side than a center C of the optical waveguide 160. The term "center C of the optical waveguide 160" as used herein means the straight line (center line) C bisecting the length of the optical waveguide 160 in the extending direction and orthogonal to the extending direction of the optical waveguide 160 in plan view as shown in FIG. 1.

The second guide layer 26 is formed on the active layer 106. The second guide layer 26 is, for example, an InGaAlP layer of second conductivity type (for example, p type). The second guide layer 26 can guide light generated in the active layer 106.

The OFS layer 36 is formed on the second guide layer 26. The OFS layer 36 is, for example, a p-type AlGaN layer. The OFS layer 36 can suppress the overflow of carriers from the active layer 106 to the second cladding layer 108 due to, for example, temperature rise.

The second cladding layer 108 is formed on the OFS layer 36. That is, the first cladding layer 104 and the second cladding layer 108 interpose therebetween the first guide layer 16, the active layer 106, the second guide layer 26, and the OFS layer 36. The second cladding layer 108 is, for example, a p-type AlGaN layer. Moreover, the second cladding layer 108 may include a strained superlattice layer formed of a p-type AlGaN layer and a p-type GaN layer.

For example, the p-type second cladding layer 108, the active layer 106 not doped with an impurity, and the n-type first cladding layer 104 constitute a pin diode. Further, the pin diode may be configured to include also the p-type OFS layer 36, the p-type second guide layer 26, and the n-type first guide layer 16. Each of the first cladding layer 104 and the second cladding layer 108 is a layer having a larger forbidden band width and a lower refractive index than those of the active layer 106. The active layer 106 has a function of generating light with current injected through the electrodes 120, 122, and 124 and guiding the light while amplifying the light. The first cladding layer 104 and the second cladding layer 108 have a function of interposing the active layer 106 therebetween to confine injected carriers (electrons and holes) and light (a function of suppressing light leakage).

In the semiconductor light-emitting device 100, when the forward bias voltage of the pin diode is applied (current is injected) between the electrode 120 and the electrodes 122 and 124, the optical waveguide 160 is generated in the active layer 106, and the recombination of electrons and holes as carriers occurs in the optical waveguide 160. Light emission occurs due to this recombination. With this generated light as a starting point, stimulated emission occurs in a chain reaction manner, so that the intensity of light is amplified in the portions of the optical waveguide 160 into which current is injected.

For example, as shown in FIG. 1, light 10 that is generated in the optical waveguide 160 and directed to the rear edge surface 132 side is amplified in the portions of the optical waveguide 160 into which current is injected, and thereafter, the light is reflected at the reflecting portion 182 and travels in the optical waveguide 160 toward the light exiting portion 181. Then, the light is further amplified in the portions of the optical waveguide 160 into which current is injected, and then exits as light 20 through the light exiting portion 181. Some of the light generated in the optical waveguide 160 directly exits as the light 20 through the light exiting portion 181.

The contact layer 110 is formed on the second cladding layer 108. The contact layer 110 is capable of being in ohmic contact with the electrodes 122 and 124. The contact layer 110 is, for example, a p-type GaN layer.

The contact layer 110 and a portion of the second cladding layer 108 constitute a columnar portion 114. The planar shape of the columnar portion 114 is, for example, the same as that of the optical waveguide 160. For example, current paths between the electrode 120 and the electrodes 122 and 124 are determined by the planar shape of the columnar portion 114, and as a result, the planar shape of the optical waveguide 160 is determined. Although not illustrated, a side surface of the columnar portion 114 may be inclined.

A groove 170 is disposed in the stacked structure 102. In the example shown in FIG. 3, the groove 170 penetrates through the contact layer 110 to reach the second cladding layer 108. That is, a bottom surface of the groove 170 is defined by a surface of the second cladding layer 108. Although not illustrated, the groove 170 may not reach the second cladding layer 108, and the bottom surface of the groove 170 may be defined by a surface of the contact layer 110. Moreover, the groove 170 may penetrate through the contact layer 110, the second cladding layer 108, and the OFS layer 36 to reach the second guide layer 26. In this case, it can be said that the bottom surface of the groove 170 is defined by an upper surface of the second guide layer 26.

The groove 170 is disposed, in plan view, at a position overlapping the optical waveguide 160 between the second electrode 122 and the third electrode 124. More specifically, the groove 170 is disposed, in plan view, between the second electrode 122 and the third electrode 124 in the extending direction of the optical waveguide 160 (a propagation direction of light). In other words, the groove 170 is disposed, in plan view, between the contact plane 112a and the contact plane 112b.

The planar shape of the groove 170 is not particularly limited, and is rectangular in the example shown in FIG. 1. Although not illustrated, the long sides of the groove 170 having a rectangular planar shape may be orthogonal to the extending direction of the optical waveguide 160. The size of the groove 170 in the extending direction of the optical waveguide 160 is, for example, equal to or more than half the thickness of the second cladding layer 108, and is desirably sufficiently smaller than the entire length of the optical waveguide 160. Specifically, the size is from 250 nm to 200 μm. Since the size of the groove 170 in the extending direction is small as described above, light can be guided in the optical waveguide 160 with little influence of the groove 170.

As shown in FIG. 3, the groove 170 may be filled with the insulating layer 118. The insulating layer 118 may be, for example, a SiN layer, a $SiO_2$ layer, a SiON layer, an $Al_2O_3$ layer, or a polyimide layer.

As shown in FIG. 2, the insulating layer 116 is formed on the second cladding layer 108 and lateral to the columnar portion 114 (around the columnar portion 114 in plan view). The insulating layer 116 is in contact with the side surface of the columnar portion 114. An upper surface of the insulating layer 116 is, for example, continuous with an upper surface 112 of the contact layer 110.

The insulating layer 116 is, for example, a SiN layer, a SiO$_2$ layer, a SiON layer, an Al$_2$O$_3$ layer, or a polyimide layer. When the material described above is used as the insulating layer 116, current between the electrode 120 and the electrodes 122 and 124 can flow through the columnar portion 114 interposed between the electrode 120 and the electrodes 122 and 124 while avoiding the insulating layer 116.

The insulating layer 116 can have a refractive index lower than that of the active layer 106. In this case, the effective refractive index in a vertical cross-section of a portion at which the insulating layer 116 is formed is lower than that in a vertical cross-section of a portion at which the insulating layer 116 is not formed, that is, a portion at which the columnar portion 114 is formed. Due to this, in a planar direction (direction orthogonal to the up-and-down direction), light can be efficiently confined in the optical waveguide 160. Although not illustrated, the insulating layer 116 may not be disposed. That is, the insulating layer 116 may be an air layer.

The first electrode 120 is formed on the entire lower surface of the substrate 101. More specifically, the first electrode 120 is formed to be in contact with a lower surface (the contact plane) 103 of a layer (the substrate 101 in the illustrated example) that is in ohmic contact with the first electrode 120. The first electrode 120 is electrically connected with the first cladding layer 104 via the substrate 101. The first electrode 120 is one of electrodes for driving the semiconductor light-emitting device 100. As the first electrode 120, for example, an electrode obtained by stacking a Ti layer, a Pt layer, and an Au layer in this order from the substrate 101 side is used.

It is also possible that a second contact layer (not shown) is disposed between the first cladding layer 104 and the substrate 101, the second contact layer is exposed on the side opposite to the substrate 101 by dry etching or the like from the side opposite to the substrate 101, and thus the first electrode 120 is disposed on the second contact layer. With this configuration, a single-sided electrode structure can be obtained. This form is particularly effective when the substrate 101 is insulating.

The second electrode 122 is formed on the contact layer 110 at a position overlapping the straight waveguide portion 162 in plan view. The second electrode 122 is an electrode located on the front edge surface 131 side of the third electrode 124 in the extending direction of the optical waveguide 160.

The second electrode 122 has a shape extending along the extending direction of the optical waveguide 160 in plan view. The straight waveguide portion 162 includes a portion overlapping the second electrode 122, in plan view, and a portion not overlapping the second electrode 122. Into the portion of the straight waveguide portion 162 overlapping the second electrode 122, current is injected through the electrodes 120 and 122.

The third electrode 124 is formed on the contact layer 110 at a position overlapping the curved waveguide portion 164 in plan view. The third electrode 124 is arranged at a position different from that at which the second electrode 122 is arranged. In the illustrated example, the third electrode 124 is further formed at a position overlapping the straight waveguide portion 162 in plan view. The third electrode 124 is an electrode located on the rear edge surface 132 side of the second electrode 122 in the extending direction of the optical waveguide 160.

The third electrode 124 has a shape extending along the extending direction of the optical waveguide 160 in plan view. Into the portion of the straight waveguide portion 162 overlapping the third electrode 124, in plan view, and the portion of the curved waveguide portion 164 overlapping the third electrode 124, current is injected through the electrodes 120 and 124.

The second electrode 122 and the third electrode 124 are spaced apart from each other. That is, it can be said that the electrode formed on the contact layer 110 is divided into plural electrodes. A gap between the second electrode 122 and the third electrode 124 is disposed at a position overlapping the straight waveguide portion 162 in plan view.

The size of a portion of the straight waveguide portion 162 not overlapping the second electrode 122 and the third electrode 124 (the size in the extending direction of the straight waveguide portion 162) is sufficiently smaller than that of portions of the straight waveguide portion 162 overlapping the second electrode 122 and the third electrode 124 (the size in the extending direction of the straight waveguide portion 162). Therefore, the straight waveguide portion 162 can guide light also in the portion not overlapping the second electrode 122 and the third electrode 124. Specifically, the size of the portion of the straight waveguide portion 162 not overlapping the second electrode 122 and the third electrode 124 is, for example, from 250 nm to 200 μm.

The current density of the straight waveguide portion 162 into which current is injected through the first electrode 120 and the second electrode 122 is higher than that of the curved waveguide portion 164 into which current is injected through the first electrode 120 and the third electrode 124. That is, the density of current injected into the straight waveguide portion 162 located between the first electrode 120 and the second electrode 122 is higher than that of current injected into the curved waveguide portion 164 located between the first electrode 120 and the third electrode 124. Further, the density of current injected into the straight waveguide portion 162 located between the first electrode 120 and the second electrode 122 is higher than that of current injected into the straight waveguide portion 162 located between the first electrode 120 and the third electrode 124. The term "current density" or "density of current" as used herein means the quantity of electricity (charge, that is, carrier) flowing in a direction perpendicular to a unit area in a unit time. Accordingly, the carrier density of the straight waveguide portion 162 into which carriers are injected through the electrodes 120 and 122 is higher than that of the curved waveguide portion 164 into which carriers are injected through the electrodes 120 and 124.

Although not illustrated, the semiconductor light-emitting device 100 may include a control unit that controls the density of current injected through the first electrode 120 and the second electrode 122 and the density of current injected through the first electrode 120 and the third electrode 124. The control unit can perform control such that the current density of the straight waveguide portion 162 into which current is injected through the electrodes 120 and 122 is higher than that of the curved waveguide portion 164 into which current is injected through the electrodes 120 and 124.

The second electrode 122 and the third electrode 124 are electrically connected with the second cladding layer 108 via the contact layer 110. The electrodes 122 and 124 are the other electrodes for driving the semiconductor light-emitting device 100. As the electrodes 122 and 124, for example, an electrode obtained by stacking a Pd layer and a Pt layer in this order from the contact layer 110 side, or the like can be used. Moreover, the electrodes 122 and 124 may include a pad electrode on the electrode structure described above. As the pad electrode, for example, an electrode obtained by stacking a Ti layer, a Pt layer, and an Au layer in this order from the contact layer 110 side, or the like can be used.

As the semiconductor light-emitting device 100 according to the first embodiment, the SLD formed using nitride semiconductor and outputting blue light at a wavelength of 450 nm has been described so far. However, for the semiconductor light-emitting device according to the invention, any material system capable of forming an optical waveguide can be used. In the case of a semiconductor material, for example, an AlGaInP-based, GaAs-based, AlGaAs-based, InGaAs-based, InGaAsP-based, InP-based, GaP-based, AlGaP-based, or ZnCdSe-based semiconductor material can be used.

In the above, the semiconductor light-emitting device 100 according to the first embodiment has been described as of so-called refractive index-guiding type in which a refractive index difference is provided for confining light between an area where the insulating layer 116 is formed and an area where the insulating layer 116 is not formed, that is, an area where the columnar portion 114 is formed. Although not illustrated, the semiconductor light-emitting device according to the invention may be of so-called gain-guiding type in which a refractive index difference is not provided due to the formation of the columnar portion 114 and the optical waveguide 160 serves as it is as a waveguide area.

In the above, as the semiconductor light-emitting device 100 according to the first embodiment, an example has been described in which the plurality of electrodes 122 and 124 electrically connected with the second cladding layer 108 are included and each of the electrodes 122 and 124 is formed along the optical waveguide 160. However, the semiconductor light-emitting device according to the invention may include a plurality of electrodes electrically connected with the first cladding layer 104 in which the electrodes are formed along the optical waveguide 160.

In the above, as the semiconductor light-emitting device 100 according to the first embodiment, an example has been described in which the two electrodes 122 and 124 electrically connected with the second cladding layer 108 and disposed along the optical waveguide 160 are included. However, the semiconductor light-emitting device according to the invention may include three or more electrodes electrically connected with the second cladding layer 108 in which the three or more electrodes are spaced apart from one another and disposed along the optical waveguide 160.

The semiconductor light-emitting device 100 according to the first embodiment is applied to, for example, a light source of a projector, a display, an illuminating device, a measuring device, or the like.

The semiconductor light-emitting device 100 has, for example, the following features.

According to the semiconductor light-emitting device 100, the current density of the straight waveguide portion 162 into which current is injected through the first electrode 120 and the second electrode 122 is higher than that of the curved waveguide portion 164 into which current is injected through the first electrode 120 and the third electrode 124. That is, the carrier density of the straight waveguide portion 162 into which carriers are injected through the electrodes 120 and 122 is higher than that of the curved waveguide portion 164 into which carriers are injected through the electrodes 120 and 124. Further, the straight waveguide portion 162 extends from the light exiting portion 181. Therefore, in the semiconductor light-emitting device 100, a reduction in light output due to gain saturation can be suppressed. The reasons will be specifically described below.

Figures 5A, 5B:
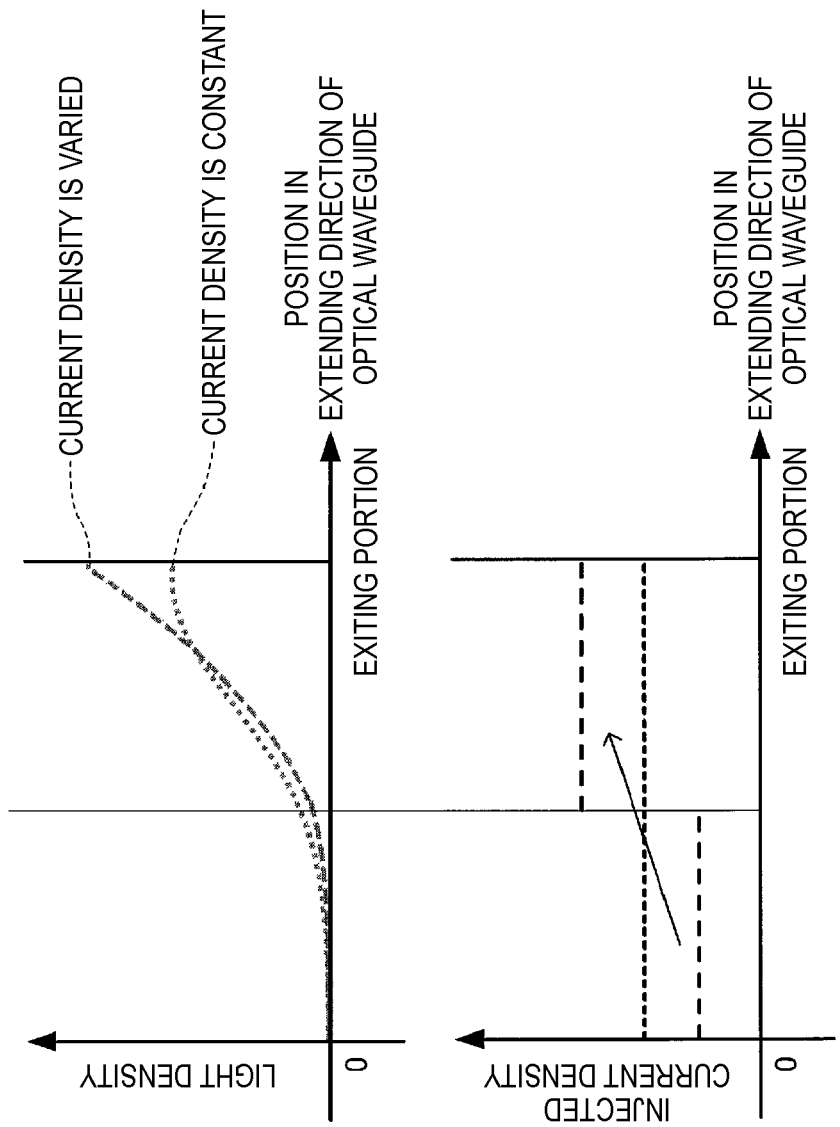
FIGS. 5A and 5B are graphs each schematically showing the relation between the position in the extending direction of the optical waveguide and the light density or the injected current density.

FIGS. 4A and 5A are graphs schematically showing the relation between the position in an extending direction of an optical waveguide and the light density. FIGS. 4B and 5B are graphs schematically showing the relation between the position in the extending direction of the optical waveguide and the injected current density. FIGS. 4A and 4B show the case where the injected current density in the extending direction of the optical waveguide is constant. FIGS. 5A and 5B show the case where the injected current density in the extending direction of the optical waveguide is varied. The term "light density" as used herein means the number of photons passing per unit area of a cross-section perpendicular to the extending direction of the optical waveguide per unit time at the position in the extending direction of the optical waveguide.

In FIGS. 4A and 4B and FIGS. 5A and 5B, it is assumed that the optical waveguide has a constant width (size in a direction orthogonal to the extending direction of the optical waveguide). Moreover, in FIGS. 4A and 4B and FIGS. 5A and 5B, only light directed from the position 0 on the horizontal axis toward the arrow direction is considered. For example, it may be conceivable that the position 0 is the rear edge surface 132.

In the SLD, light is exponentially amplified toward the light exiting portion (low reflectance side) through which the light exits. Therefore, as shown in FIGS. 4A and 4B, the light density has a non-uniform distribution in the extending direction of the optical waveguide, and gain saturation occurs on the light exiting portion side where the light density is high. That is, when the injected current density (that is, carrier density) is constant in the extending direction of the optical waveguide, the number of carriers is insufficient relative to light (to photons) on the light exiting portion side. That is, when light is to be amplified, the number of carriers that are converted into light is insufficient. As a result, gain saturation occurs, and a light output is reduced corresponding to the amount of gain saturation.

At the portion where the light density is low (the side opposite to the light exiting portion side), there are many carriers compared with that of the light exiting portion side. Therefore, carriers are not sufficiently converted into light, and there are excess carriers. As shown in FIGS. 5A and 5B, the excess carriers are injected into the light exiting portion side where the number of carriers is insufficient, so that high-output and highly efficient driving can be performed. That is, by varying the current density, gain saturation is reduced while maintaining the magnitude of injected current of the entire optical waveguide constant, so that a final light output can be increased.

In the semiconductor light-emitting device 100, as described above, the current density (carrier density) of the straight waveguide portion 162 including the light exiting portion 181 is made higher than that of the curved waveguide portion 164, so that a reduction in light output due to gain saturation can be suppressed while maintaining the magnitude of current injected into the entire optical waveguide 160 constant. That is, in the semiconductor light-emitting device 100, even when the magnitude of current injected into the entire optical waveguide 160 is made the same as that of current injected into the entire optical waveguide whose current density is constant in the extending direction of the optical waveguide, higher output can be achieved. As a result, in the semiconductor light-emitting device 100, high-output and highly efficient driving can be performed.

Further, in the semiconductor light-emitting device 100, the current density of the straight waveguide portion 162 is made higher than that of the curved waveguide portion 164, so that light loss in the curved waveguide portion 164 can be reduced. For example, when the current density of a curved waveguide portion having a shape with a curvature is made higher than that of a straight waveguide portion, light loss in the curved waveguide portion is increased, failing in some cases to achieve higher efficiency.

Further, in the semiconductor light-emitting device 100, the straight waveguide portion 162 is inclined to the normal P of the front edge surface 131. Therefore, in the semiconductor light-emitting device 100, direct multiple reflection of light generated in the optical waveguide 160 can be reduced between the first end surface 181 and the second end surface 182. Due to this, the formation of a direct resonator can be prevented, so that laser oscillation of the light generated in the optical waveguide 160 can be suppressed. Accordingly, in the semiconductor light-emitting device 100, speckle noise can be reduced.

According to the semiconductor light-emitting device 100, the curved waveguide portion 164 perpendicularly reaches the rear edge surface 132. Therefore, light loss at the reflecting portion 182 can be reduced.

According to the semiconductor light-emitting device 100, the curved waveguide portion 164 is formed closer to the rear edge surface 132 side of the stacked structure 102 than the center C of the optical waveguide 160. In the semiconductor light-emitting device 100, for example, the reflectance of the rear edge surface 132 is high, while the reflectance of the front edge surface 131 is extremely low. Therefore, a very large difference in light intensity exists between the front edge surface 131 and the rear edge surface 132. By forming the curved waveguide portion 164 in this low light-intensity area, light loss in the curved waveguide portion 164 can be reduced. The light intensity is a light intensity at a certain point in the waveguide direction (extending direction) in the optical waveguide. To be exact, the light intensity is an integration of a light distribution over a waveguide surface and a light density in view of the waveguide surface distribution.

According to the semiconductor light-emitting device 100, the high-reflectance film 142 in which a plurality of dielectric films are stacked is formed on the rear edge surface 132. Therefore, in a wavelength band of light generated in the optical waveguide 160, the reflectance of the rear edge surface 132 can be made high, so that the semiconductor light-emitting device 100 can include the reflecting portion 182 with a little light loss.

According to the semiconductor light-emitting device 100, the extremely-low-reflectance film 140 as a single layer or multiple layers of dielectric films is formed on the front edge surface 131. Therefore, in the wavelength band of the light generated in the optical waveguide 160, the reflectance of the front edge surface 131 can be made low, so that the semiconductor light-emitting device 100 can include the light exiting portion 181 with a little light loss. Further, due to the extremely-low-reflectance film 140, direct multiple reflection of the light generated in the optical waveguide 160 can be reduced between the first end surface 181 and the second end surface 182. Due to this, the formation of a direct resonator can be prevented, so that laser oscillation of the light generated in the optical waveguide 160 can be suppressed.

According to the semiconductor light-emitting device 100, the groove 170 is disposed, in plan view, at a position overlapping the optical waveguide 160 between the second electrode 122 and the third electrode 124 (between the contact plane 112a and the contact plane 112b). With this configuration, the insulating property between the second electrode 122 and the third electrode 124 can be enhanced. Moreover, due to a difference in carrier density between the straight waveguide portion 162 and the curved waveguide portion 164, the movement of carriers can be suppressed. As a result, a reduction in light output can be suppressed.

1.2. Method for Manufacturing Semiconductor Light-Emitting Device

Figure 6:
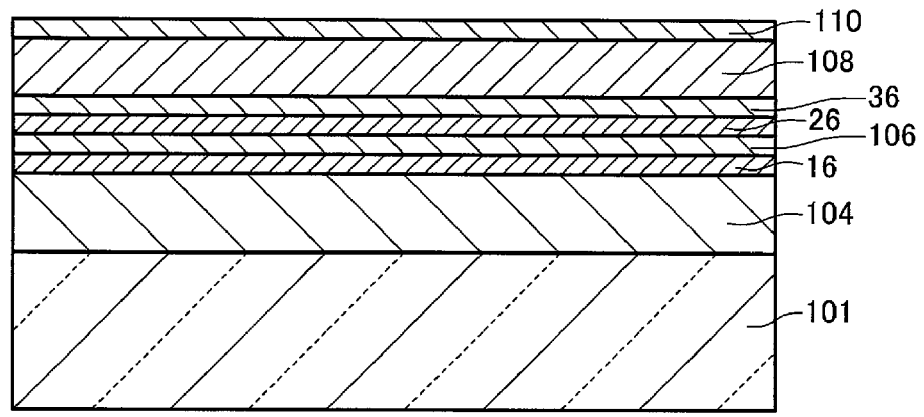
FIG. 6 is a cross-sectional view schematically showing a manufacturing step of the semiconductor light-emitting device according to the first embodiment.
Figure 7:
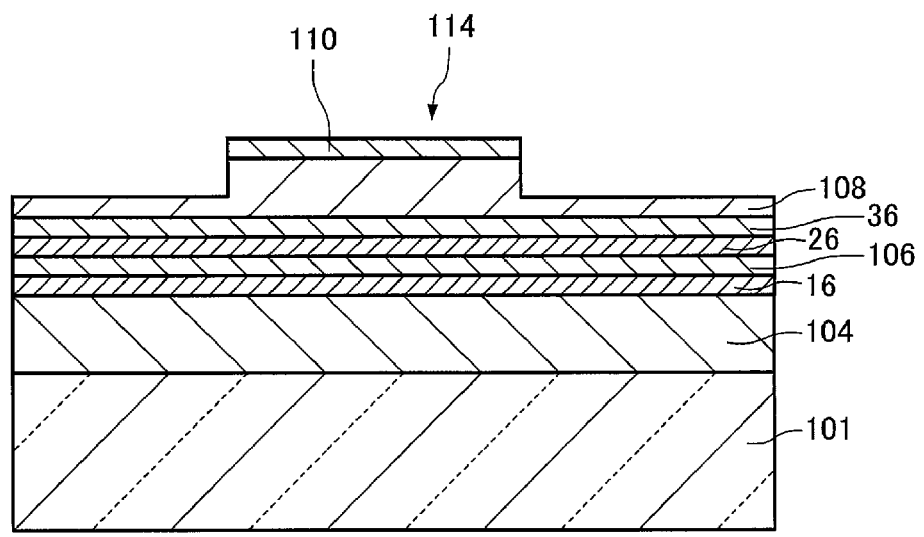
FIG. 7 is a cross-sectional view schematically showing a manufacturing step of the semiconductor light-emitting device according to the first embodiment.
Figure 8:
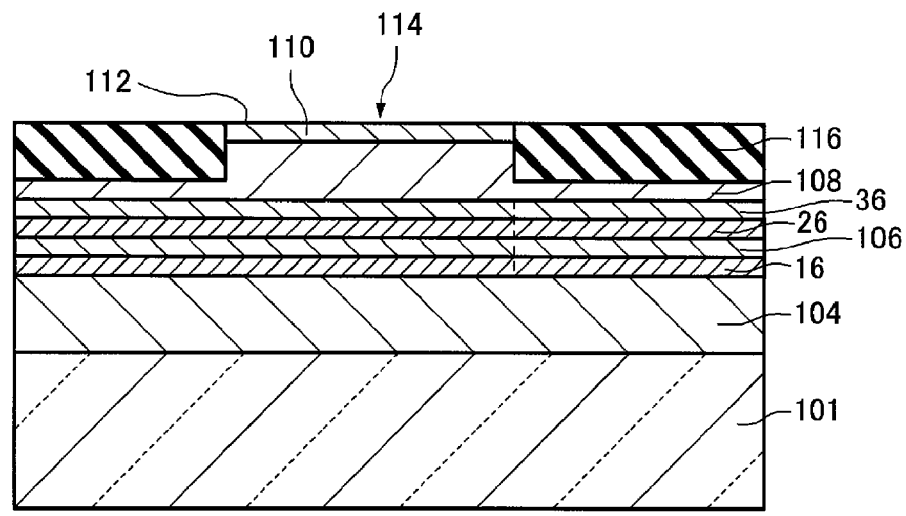
FIG. 8 is a cross-sectional view schematically showing a manufacturing step of the semiconductor light-emitting device according to the first embodiment.

Next, a method for manufacturing the semiconductor light-emitting device according to the first embodiment will be described with reference to the drawings. FIGS. 6 to 8 are cross-sectional views schematically showing manufacturing steps of the semiconductor light-emitting device 100 according to the first embodiment, corresponding to FIG. 2.

As shown in FIG. 6, the first cladding layer 104, the first guide layer 16, the active layer 106, the second guide layer 26, the OFS layer 36, the second cladding layer 108, and the contact layer 110 are epitaxially grown in this order on the substrate 101. As the method of epitaxial growth, for example, a metal organic chemical vapor deposition (MOCVD) method or a molecular beam epitaxy (MBE) method is used.

As shown in FIG. 7, the contact layer 110 and the second cladding layer 108 are patterned. The patterning is performed using, for example, photolithography and etching. Through this step, the columnar portion 114 can be formed. Moreover, in this step, the groove 170 (refer to FIG. 3) can be formed. The step of forming the columnar portion 114 and the step of forming the groove 170 may be performed in separate steps.

As shown in FIG. 8, the insulating layer 116 is formed so as to cover the side surface of the columnar portion 114. Specifically, for example, an insulating member (not shown) is first deposited on the second cladding layer 108 (also on the contact layer 110) by a chemical vapor deposition (CVD) method, a coating method, or the like. Next, the upper surface 112 of the contact layer 110 is exposed by, for example, etching. Through the step described above, the insulating layer 116 can be formed. Moreover, in this step, the insulating layer 118 (refer to FIG. 3) can be formed in the groove 170. The step of forming the insulating layer 116 and the step of forming the insulating layer 118 may be performed in separate steps.

As shown in FIGS. 1 and 2, the electrodes 122 and 124 are formed on the contact layer 110. The electrodes 122 and 124 are formed by, for example, a vacuum evaporation method. The electrodes 122 and 124 may be formed by forming a predetermined shaped mask layer (not shown), depositing an electrode layer thereon, and then removing the mask layer (lift-off). Thereafter, heat treatment for alloying may be performed. Moreover, the formation of the electrodes 122 and 124 may include a step of forming a pad electrode. The pad electrode may be formed by, for example, a vacuum evaporation method. When the forming step of the pad electrode is included, the order of the heat treatment step for alloying and the forming step of the pad electrode is not particularly limited. That is, the forming step of the pad electrode may be performed after the heat treatment step for alloying.

Next, the first electrode 120 is formed on the lower surface of the substrate 101. Before forming the first electrode 120, the substrate 101 may be thinned by polishing the lower surface of the substrate 101. The first electrode 120 is formed by, for example, a vacuum evaporation method. After the deposition using a vacuum evaporation method, heat treatment for alloying may be performed. The order of the step of forming the electrode 120 and the step of forming the electrodes 122 and 124 is not particularly limited.

As shown in FIG. 1, the edge surfaces 131, 132, 133, and 134 of the stacked structure 102 are exposed by, for example, cleavage. Next, the extremely-low-reflectance film 140 is formed on the front edge surface 131, and the high-reflectance film 142 is formed on the rear edge surface 132. The extremely-low-reflectance film 140 and the high-reflectance film 142 are formed by, for example, a CVD method. The order of the step of forming the extremely-low-reflectance film 140 and the step of forming the high-reflectance film 142 is not particularly limited.

Through the steps described above, the semiconductor light-emitting device 100 can be manufactured.

According to the method for manufacturing the semiconductor light-emitting device 100, it is possible to obtain the semiconductor light-emitting device 100 that can suppress a reduction in light output due to gain saturation.

1.3. Modified Examples of Semiconductor Light-Emitting Device

1.3.1. First Modified Example

Figure 9:
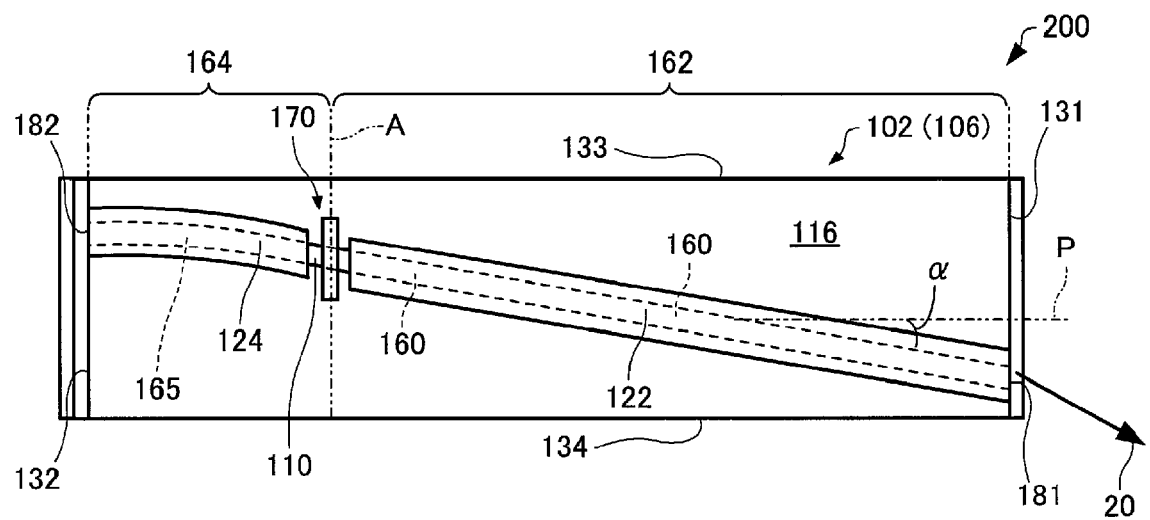
FIG. 9 is a plan view schematically showing a semiconductor light-emitting device according to a first modified example of the first embodiment.

Next, a semiconductor light-emitting device according to a first modified example of the first embodiment will be described with reference to the drawing. FIG. 9 is a plan view schematically showing a semiconductor light-emitting device 200 according to the first modified example of the first embodiment.

Hereinafter, in the semiconductor light-emitting device 200 according to the first modified example of the first embodiment, members having functions similar to those of the constituent members of the semiconductor light-emitting device 100 according to the first embodiment are denoted by the same reference numerals and signs, and the detailed description thereof is omitted. The same applies to semiconductor light-emitting devices 300 and 400, which will be shown below, according to modified examples of the first embodiment.

In the semiconductor light-emitting device 100, as shown in FIG. 1, the gap between the second electrode 122 and the third electrode 124 is disposed, in plan view, at the position overlapping the straight waveguide portion 162. That is, the straight waveguide portion 162 includes the portion into which current is injected through the electrodes 120 and 122 and the portion into which current is injected through the electrodes 120 and 124.

In contrast to this, in the semiconductor light-emitting device 200 as shown in FIG. 9, the gap between the second electrode 122 and the third electrode 124 is disposed, in plan view, at a position overlapping a border line A between the straight waveguide portion 162 and the curved waveguide portion 164. In the illustrated example, the groove 170 is also disposed at the position overlapping the border line A. In the semiconductor light-emitting device 200, current is injected into the straight waveguide portion 162 only through the electrodes 120 and 122. Current is injected into the curved waveguide portion 164 only through the electrodes 120 and 124. For example, the curved waveguide portion 164 may be composed of the curved waveguide 165, and the border line A may be arranged at an end of the curved waveguide 165.

In the semiconductor light-emitting device 200, a reduction in light output due to gain saturation can be suppressed similarly to the semiconductor light-emitting device 100.

1.3.2. Second Modified Example

Figure 10:
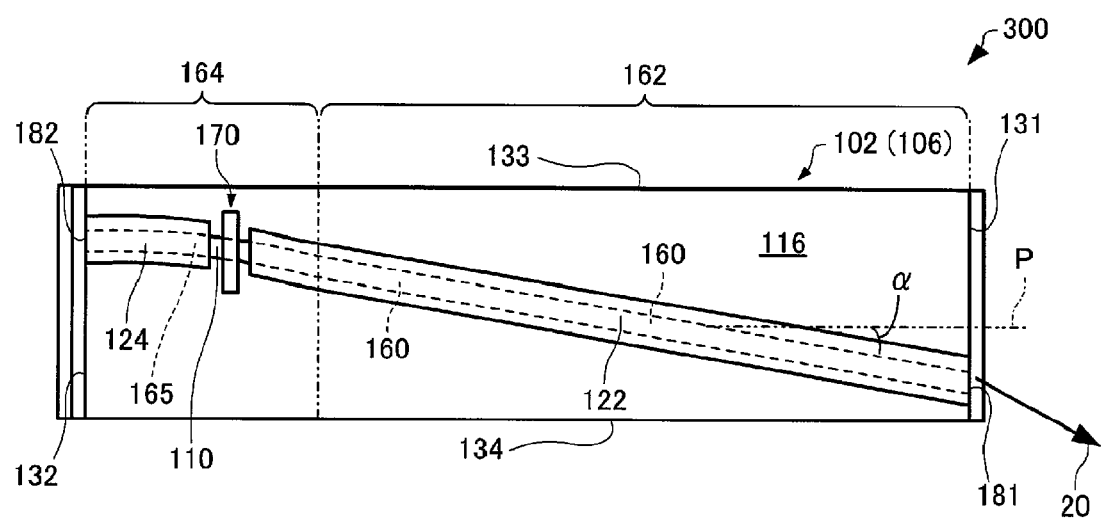
FIG. 10 is a plan view schematically showing a semiconductor light-emitting device according to a second modified example of the first embodiment.

Next, a semiconductor light-emitting device according to a second modified example of the first embodiment will be described with reference to the drawing. FIG. 10 is a plan view schematically showing the semiconductor light-emitting device 300 according to the second modified example of the first embodiment.

In the semiconductor light-emitting device 100, as shown in FIG. 1, the gap between the second electrode 122 and the third electrode 124 is disposed, in plan view, at the position overlapping the straight waveguide portion 162. That is, the straight waveguide portion 162 includes the portion into which current is injected through the electrodes 120 and 122 and the portion into which current is injected through the electrodes 120 and 124.

In contrast to this, in the semiconductor light-emitting device 300 as shown in FIG. 10, the gap between the second electrode 122 and the third electrode 124 is disposed, in plan view, at a position overlapping the curved waveguide 165. In the illustrated example, the groove 170 is also disposed at the position overlapping the curved waveguide 165. In the semiconductor light-emitting device 300, current is injected into the straight waveguide portion 162 only through the electrodes 120 and 122. The curved waveguide portion 164 includes a portion into which current is injected through the electrodes 120 and 122 and a portion into which current is injected through the electrodes 120 and 124. For example, the curved waveguide portion 164 may be composed of the curved waveguide 165.

In the semiconductor light-emitting device 300, a reduction in light output due to gain saturation can be suppressed similarly to the semiconductor light-emitting device 100.

1.3.3. Third Modified Example

Figure 11:
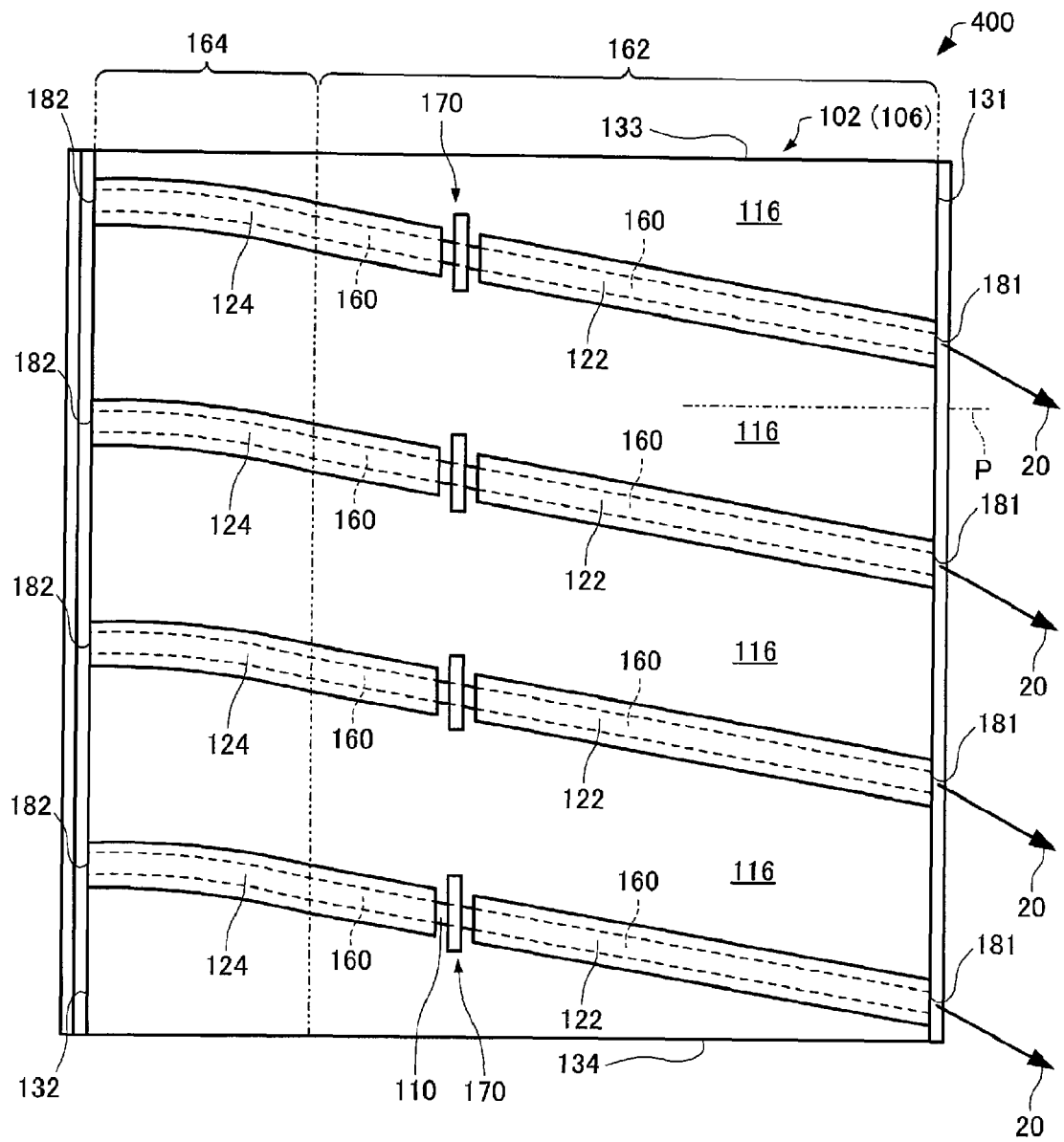
FIG. 11 is a plan view schematically showing a semiconductor light-emitting device according to a third modified example of the first embodiment.

Next, a semiconductor light-emitting device according to a third modified example of the first embodiment will be described with reference to the drawing. FIG. 11 is a plan view schematically showing the semiconductor light-emitting device 400 according to the third modified example of the first embodiment.

In the semiconductor light-emitting device 100, as shown in FIG. 1, one optical waveguide 160 is disposed. In contrast to this, in the semiconductor light-emitting device 400 as shown in FIG. 11, a plurality of optical waveguides 160 are disposed. In the illustrated example, four optical waveguides 160 are disposed. However, the number of optical waveguides is not particularly limited as long as the number is two or more. The plurality of optical waveguides 160 are arrayed in a direction orthogonal to the normal P of the front edge surface 131. In the illustrated example, a plurality of light exiting portions 181 are aligned at equal intervals.

According to the semiconductor light-emitting device 400, higher output can be achieved compared with the example of the semiconductor light-emitting device 100.

2. Second Embodiment

2.1. Semiconductor Light-Emitting Device

Figure 12:
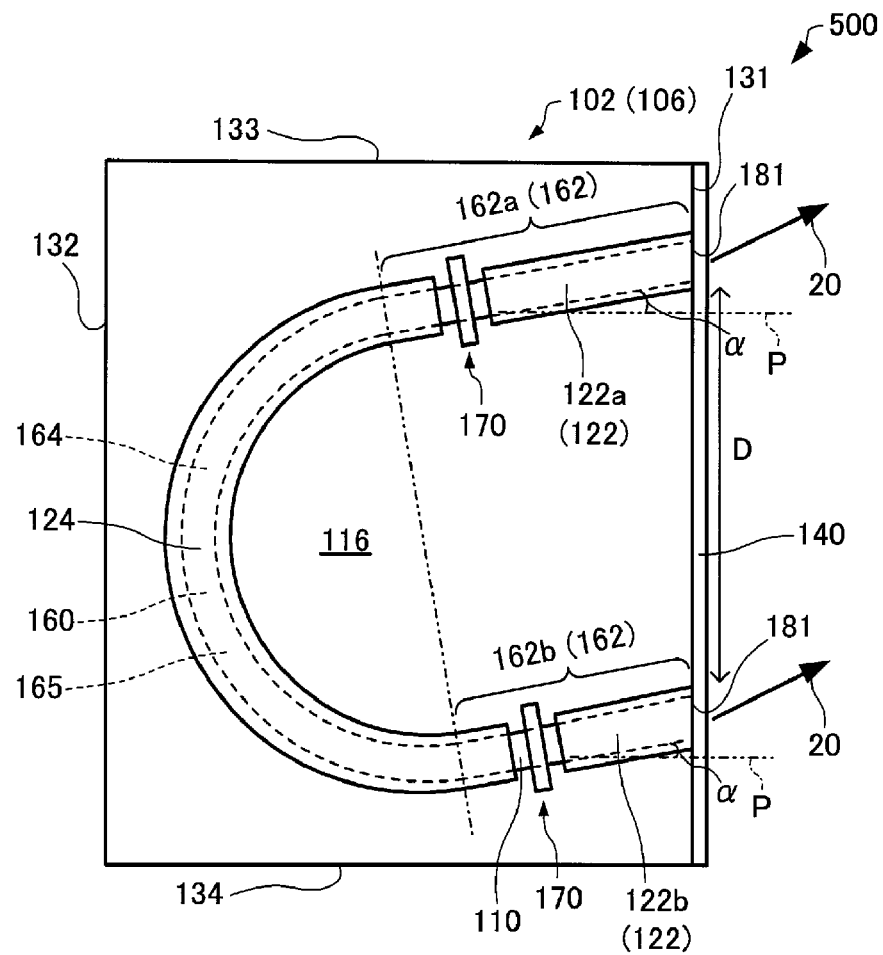
FIG. 12 is a plan view schematically showing a semiconductor light-emitting device according to a second embodiment.

Next, a semiconductor light-emitting device according to a second embodiment will be described with reference to the drawing. FIG. 12 is a plan view schematically showing a semiconductor light-emitting device 500 according to the second embodiment.

Hereinafter, in the semiconductor light-emitting device 500 according to the second embodiment, members having functions similar to those of the constituent members of the semiconductor light-emitting device 100 according to the first embodiment are denoted by the same reference numerals and signs, and the detailed description thereof is omitted.

In the semiconductor light-emitting device 100, as shown in FIG. 1, one straight waveguide portion 162 is disposed, and one light exiting portion 181 is disposed. In contrast to this, in the semiconductor light-emitting device 500 as shown in FIG. 12, two straight waveguide portions 162 are disposed, and two light exiting portions 181 are disposed.

An extending direction of one straight waveguide portion 162a of the two straight waveguide portions 162 is parallel to an extending direction of the other straight waveguide portion 162b. Due to this, the light 20 that exits through the first end surface 181 of the straight waveguide portion 162a can exit in the same direction as the light 20 that exits through the first end surface 181 of the straight waveguide portion 162b. A gap D between the first end surface 181 of the straight waveguide portion 162a and the first end surface 181 of the straight waveguide portion 162b is, for example, from several hundreds μm to 1 mm. The extending direction of the straight waveguide portion 162a may not be parallel to the extending direction of the straight waveguide portion 162b.

The sentence "the extending direction of the straight waveguide portion 162a is parallel to the extending direction of the other straight waveguide portion 162b" as used herein means that in view of manufacturing variations or the like, an inclination angle of the extending direction of the straight waveguide portion 162b to the extending direction of the straight waveguide portion 162a is within ±1° in plan view.

The curved waveguide portion 164 is composed of the curved waveguide 165 that connects the straight waveguide portion 162a with the straight waveguide portion 162b. The curved waveguide portion 164 is disposed spaced apart from the rear edge surface 132. The curved waveguide portion 164 does not include a reflecting portion, and a high-reflectance film is not disposed on the rear edge surface 132. The radius of curvature of the curved waveguide 165 is appropriately determined by the gap between the straight waveguide portion 162a and the straight waveguide portion 162b, and is, for example, about 1 mm. The entire length (length in the extending direction) of the optical waveguide 160 is not particularly limited, and is, for example, about 3 mm.

In the illustrated example, the straight waveguide portions 162a and 162b are inclined at the angle c to the normal P of the front edge surface 131 and connected with the front edge surface 131. However, the straight waveguide portions 162a and 162b may be orthogonal to the front edge surface 131. That is, the extending direction of the straight waveguide portions 162a and 162b may be parallel to the normal P. Also in such a form, since the extremely-low-reflectance film 140 is formed on the front edge surface 131, direct multiple reflection of light generated in the optical waveguide 160 can be reduced between the first end surface 181 of the straight waveguide portion 162a and the first end surface 181 of the straight waveguide portion 162b in the semiconductor light-emitting device 500. Due to this, the formation of a direct resonator can be prevented, so that laser oscillation of the light generated in the optical waveguide 160 can be suppressed.

In the semiconductor light-emitting device 500, two second electrodes 122 are disposed corresponding to the straight waveguide portions 162. In the illustrated example, a second electrode 122a is disposed at a position overlapping the straight waveguide portion 162a, and a second electrode 122b is disposed at a position overlapping the straight waveguide portion 162b.

In the semiconductor light-emitting device 500, the density of current injected through the second electrode 122a may be the same in magnitude as that of current injected through the second electrode 122b. Due to this, compared with the case where the density of current injected through the second electrode 122a is different in magnitude from that of current injected through the second electrode 122b, current control in driving can be easily performed. Moreover, the second electrode 122a and the second electrode 122b may be electrically connected. Further, the second electrode 122a and the second electrode 122b may be composed of a common electrode.

According to the semiconductor light-emitting device 500, a reduction in light output due to gain saturation can be suppressed similarly to the semiconductor light-emitting device 100.

According to the semiconductor light-emitting device 500, since the curved waveguide portion 164 does not include a reflecting portion, light loss at the reflecting portion can be eliminated.

2.2. Method for Manufacturing Semiconductor Light-Emitting Device

Next, a method for manufacturing the semiconductor light-emitting device according to the second embodiment will be described. The method for manufacturing the semiconductor light-emitting device according to the second embodiment is basically the same as that of the semiconductor light-emitting device 100 according to the first embodiment, excepting that the high-reflectance film 142 is not formed on the rear edge surface 132. Therefore, the detailed description thereof is omitted.

2.3. Modified Examples of Semiconductor Light-Emitting Device

2.3.1. First Modified Example

Figure 13:
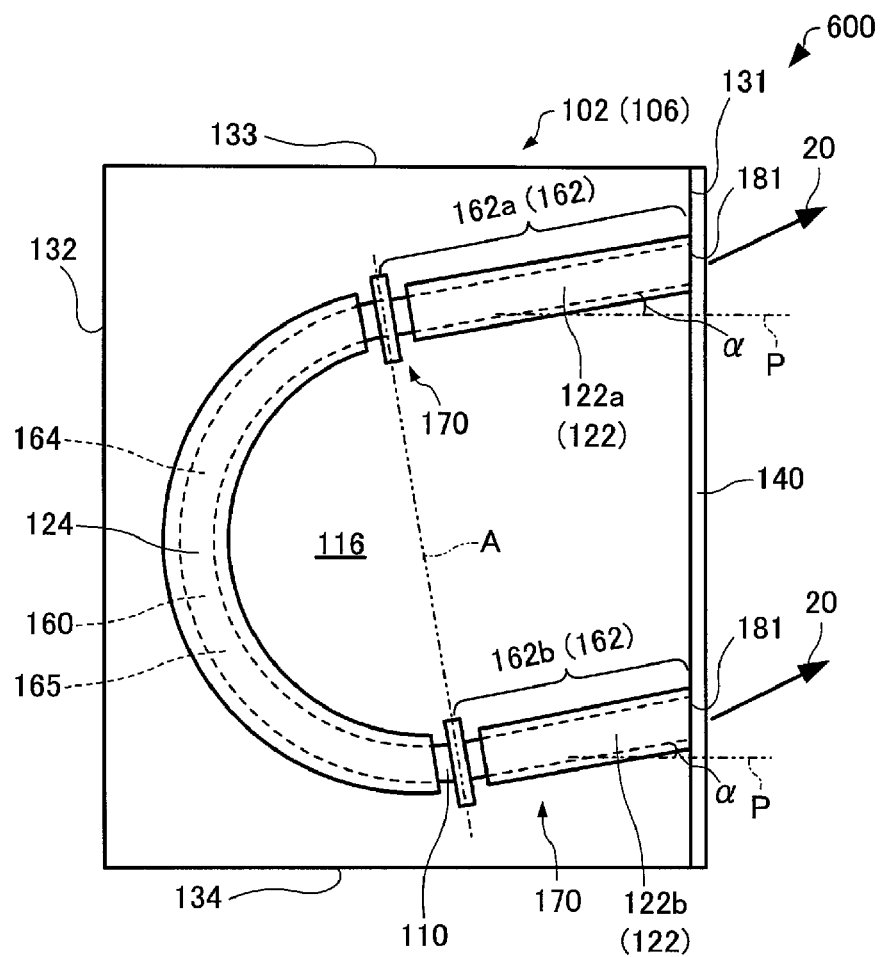
FIG. 13 is a plan view schematically showing a semiconductor light-emitting device according to a first modified example of the second embodiment.

Next, a semiconductor light-emitting device according to a first modified example of the second embodiment will be described with reference to the drawing. FIG. 13 is a plan view schematically showing a semiconductor light-emitting device 600 according to the first modified example of the second embodiment.

Hereinafter, in the semiconductor light-emitting device 600 according to the first modified example of the second embodiment, members having functions similar to those of the constituent members of the semiconductor light-emitting device 100 according to the first embodiment and the semiconductor light-emitting device 500 according to the second embodiment are denoted by the same reference numerals and signs, and the detailed description thereof is omitted. The same applies to a semiconductor light-emitting device 700, which will be shown below, according to a second modified example of the second embodiment.

In the semiconductor light-emitting device 500, as shown in FIG. 12, each of the gaps between the second electrodes 122 and the third electrode 124 is disposed, in plan view, at the position overlapping the straight waveguide portion 162. That is, each of the straight waveguide portions 162 includes a portion into which current is injected through the electrodes 120 and 122 and a portion into which current is injected through the electrodes 120 and 124.

In contrast to this, in the semiconductor light-emitting device 600 as shown in FIG. 13, each of the gaps between the second electrodes 122 and the third electrode 124 is disposed, in plan view, at a position overlapping the border line A between the straight waveguide portions 162 and the curved waveguide portion 164 (the curved waveguide 165). In the illustrated example, each of the grooves 170 is also disposed at the position overlapping the border line A. In the semiconductor light-emitting device 600, current is injected into the straight waveguide portions 162 only through the electrodes 120 and 122. Current is injected into the curved waveguide portion 164 only through the electrodes 120 and 124.

In the semiconductor light-emitting device 600, a reduction in light output due to gain saturation can be suppressed similarly to the semiconductor light-emitting device 500.

2.3.2. Second Modified Example

Figure 14:
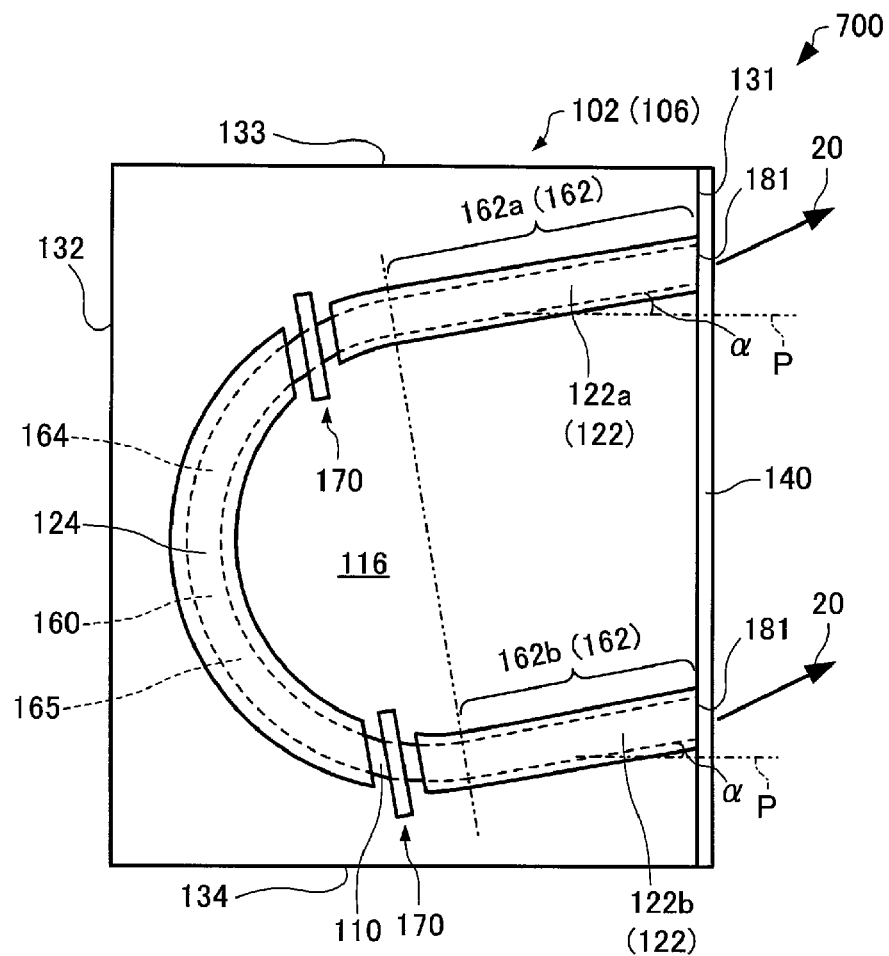
FIG. 14 is a plan view schematically showing a semiconductor light-emitting device according to a second modified example of the second embodiment.

Next, a semiconductor light-emitting device according to the second modified example of the second embodiment will be described with reference to the drawing. FIG. 14 is a plan view schematically showing the semiconductor light-emitting device 700 according to the second modified example of the second embodiment.

In the semiconductor light-emitting device 500, as shown in FIG. 12, each of the gaps between the second electrodes 122 and the third electrode 124 is disposed, in plan view, at the position overlapping the straight waveguide portion 162. That is, each of the straight waveguide portions 162 includes the portion into which current is injected through the electrodes 120 and 122 and the portion into which current is injected through the electrodes 120 and 124.

In contrast to this, in the semiconductor light-emitting device 700 as shown in FIG. 14, each of the gaps between the second electrodes 122 and the third electrode 124 is disposed, in plan view, at a position overlapping the curved waveguide portion 164 (the curved waveguide 165). In the illustrated example, each of the grooves 170 is also disposed at the position overlapping the curved waveguide portion 164 (the curved waveguide 165). In the semiconductor light-emitting device 700, current is injected into the straight waveguide portions 162 only through the electrodes 120 and 122. The curved waveguide portion 164 includes a portion into which current is injected through the electrodes 120 and 122 and a portion into which current is injected through the electrodes 120 and 124.

In the semiconductor light-emitting device 700, a reduction in light output due to gain saturation can be suppressed similarly to the semiconductor light-emitting device 500.

3. Third Embodiment

Figure 15:
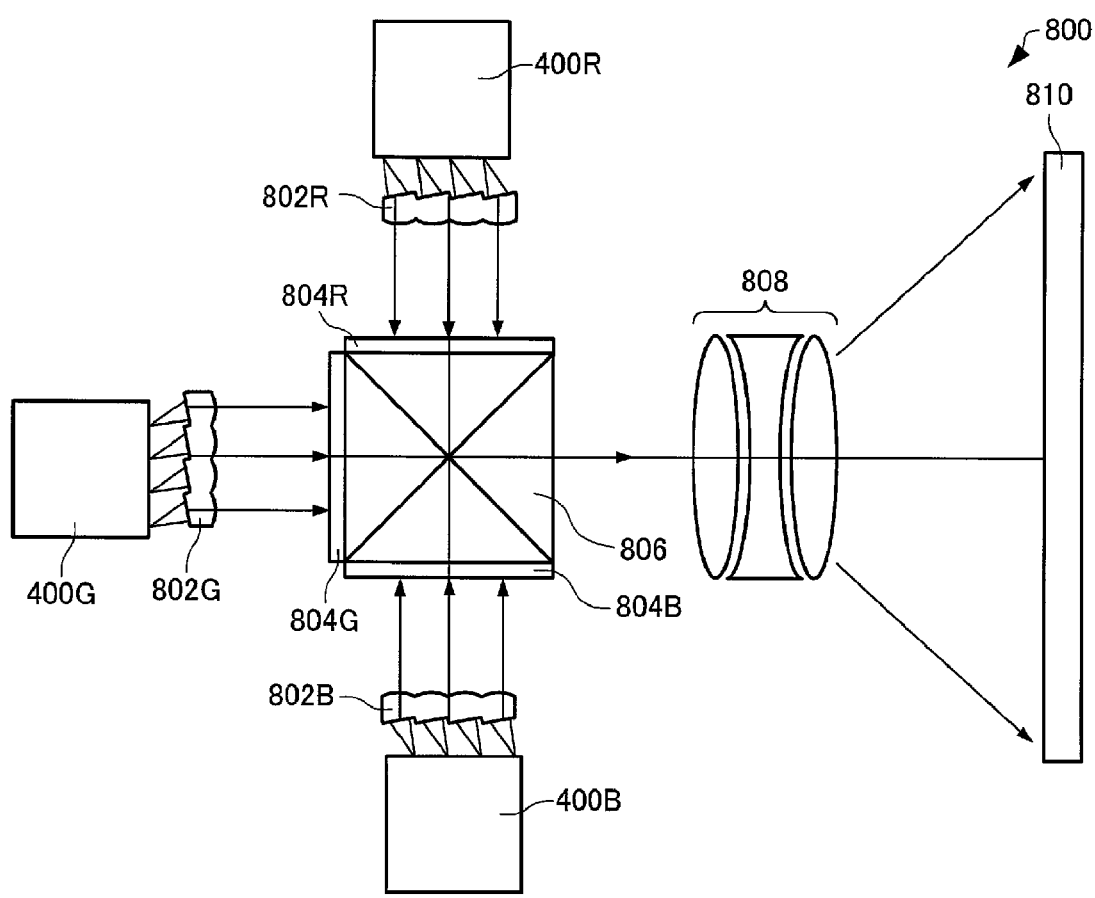
FIG. 15 schematically shows a projector according to a third embodiment.
Figure 16:
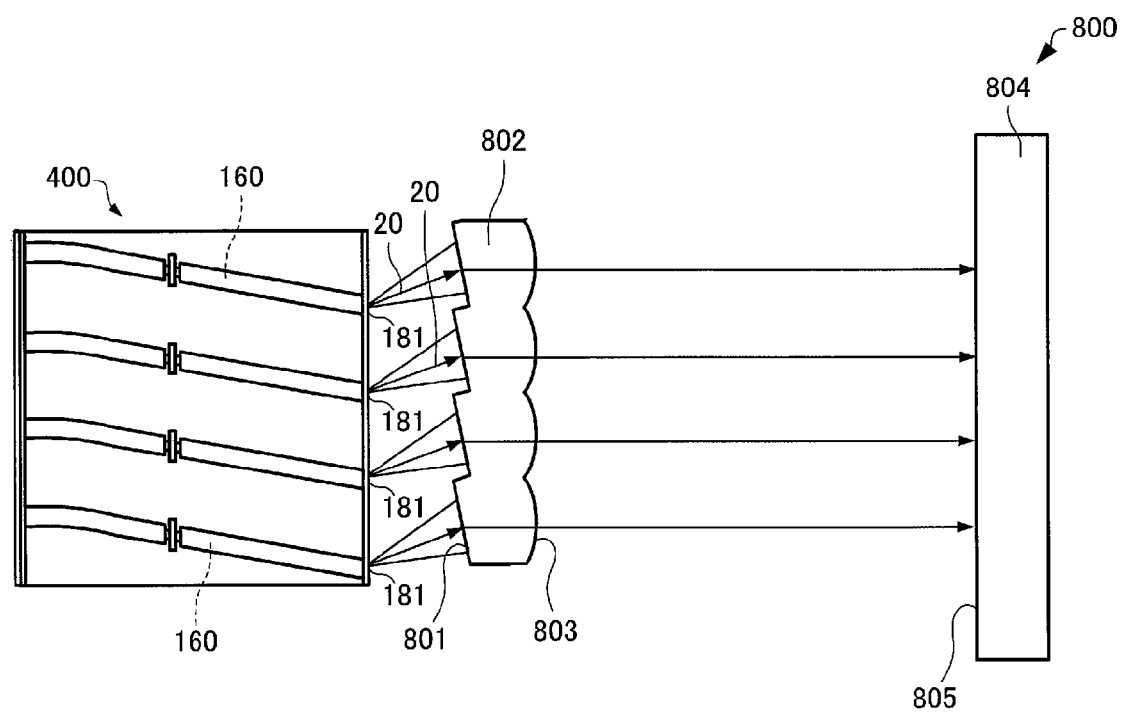
FIG. 16 schematically shows the projector according to the third embodiment.

Next, a projector according to a third embodiment will be described with reference to the drawings. FIG. 15 schematically shows a projector 800 according to the third embodiment. FIG. 16 schematically shows a portion of the projector 800 according to the third embodiment.

For convenience sake, in FIG. 15, a housing constituting the projector 800 is omitted, and further, a light source 400 is shown in a simplified manner. In FIG. 16, for convenience sake, the light source 400, a lens array 802, and a liquid crystal light valve 804 are shown, and further, the light source 400 is shown in a simplified manner.

As shown in FIGS. 15 and 16, the projector 800 includes a red light source 400R, a green light source 400G, and a blue light source 400B that respectively emit red light, green light, and blue light. The red light source 400R, the green light source 400G, and the blue light source 400B each are the semiconductor light-emitting device according to the invention. Hereinafter, an example will be described in which the semiconductor light-emitting device 400 is used as the semiconductor light-emitting device according to the invention.

The projector 800 further includes lens arrays 802R, 802G, and 802B, transmissive liquid crystal light valves (light modulation devices) 804R, 804G, and 804B, and a projection lens (projection device) 808.

Lights emitted from the light sources 400R, 400G, and 400B are respectively incident on the lens arrays 802R, 802G, and 802B. As shown in FIG. 16, the lens array 802 includes, on the light source 400 side, flat surfaces 801 on each of which the light 20 exiting through the light exiting portion 181 is incident. The plurality of flat surfaces 801 are disposed corresponding to the plurality of light exiting portions 181, and arranged at equal intervals. A normal (not shown) of the flat surface 801 is inclined to an optical axis of the light 20. Accordingly, due to the flat surface 801, the optical axis of the light 20 can be made orthogonal to an irradiated surface 805 of the liquid crystal light valve 804.

The lens array 802 includes convex curved surfaces 803 on the liquid crystal light valve 804 side. The plurality of convex curved surfaces 803 are disposed corresponding to the plurality of flat surfaces 801, and arranged at equal intervals. The lights 20 whose optical axes are converted on the flat surfaces 801 are collected or reduced in diffusion angle by the convex curved surfaces 803, so that the lights can be superimposed (partially superimposed). Due to this, the liquid crystal light valve 804 can be irradiated with good uniformity.

As described above, the lens array 802 can control the optical axes of the lights 20 emitted from the light source 400 to thereby collect the lights 20.

As shown in FIG. 15, lights collected by the lens arrays 802R, 802G, and 802B are respectively incident on the liquid crystal light valves 804R, 804G, and 804B. Each of the liquid crystal light valves 804R, 804G, and 804B modulates the incident light according to image information. Then, the projection lens 808 magnifies an image formed by the liquid crystal light valves 804R, 804G, and 804B and projects the image onto a screen (display surface) 810.

Moreover, the projector 800 can include a cross dichroic prism (color light combining unit) 806 that combines the lights emitted from the liquid crystal light valves 804R, 804G, and 804B and introduces the combined light to the projection lens 808.

Three color lights modulated by the respective liquid crystal light valves 804R, 804G, and 804B are incident on the cross dichroic prism 806. This prism is formed by bonding four right-angle prisms together, and a dielectric multilayer film that reflects red light and a dielectric multilayer film that reflects blue light are arranged crosswise on its inner surface. With these dielectric multilayer films, the three color lights are combined to form light representing a color image. Then, the combined light is projected onto the screen 810 through the projection lens 808 as a projection optical system, so that a magnified image is displayed.

According to the projector 800, it is possible to include the semiconductor light-emitting device 400 that can suppress a reduction in light output due to gain saturation.

According to the projector 800, since the projector is of a type (backlight type) in which the light source 400 is arranged just below the liquid crystal light valve 804 and light collection and uniform illumination are simultaneously performed using the lens array 802, a reduction in the loss of the optical system and a reduction in the number of components can be achieved.

In the example described above, the transmissive liquid crystal light valve is used as a light modulation device. However, a light valve other than that of liquid crystal may be used, or a reflective light valve may be used. Examples of such a light valve include, for example, a reflective liquid crystal light valve and a digital micromirror device. Moreover, the configuration of the projection optical system is appropriately changed depending on the types of a light valve to be used.

Moreover, the light source 400 can also be applied to a light source device of a scanning type image display device (projector) having a scanning unit as an image forming device in which scanning is performed on a screen with light from the light source 400 to thereby display a desired size image on a display surface.

The embodiments and modified examples described above are illustrative only, and the invention is not limited to them. For example, each of the embodiments and each of the modified examples can be appropriately combined.

The invention includes a configuration (for example, a configuration having the same function, method, and result, or a configuration having the same advantage and effect) that is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

The entire disclosure of Japanese Patent Application No. 2013-036771, filed Feb. 27, 2013 is expressly incorporated by reference herein.

What is claimed is:

1. A semiconductor light-emitting device comprising:
   a stacked structure including a light-emitting layer, a first cladding layer, and a second cladding layer, the first cladding layer and the second cladding layer interposing the light-emitting layer therebetween;
   a first electrode electrically connected with the first cladding layer;
   a second electrode electrically connected with the second cladding layer; and
   a third electrode electrically connected with the second cladding layer and arranged at a position different from that at which the second electrode is arranged, wherein
   the stacked structure includes an optical waveguide,
   the optical waveguide includes
      a straight waveguide portion extending from a light exiting portion along a straight line inclined to a normal of a front edge surface of the stacked structure, the light exiting portion being disposed on the front edge surface of the stacked structure, and
      a curved waveguide portion continuous with the straight waveguide portion and including a curved waveguide having a shape with a curvature, and
   the density of current injected into the straight waveguide portion located between the first electrode and the second electrode is higher than that of current injected into the curved waveguide portion located between the first electrode and the third electrode.

2. The semiconductor light-emitting device according to claim 1, wherein
   the density of current injected into the straight waveguide portion located between the first electrode and the second electrode is higher than that of current injected into the straight waveguide portion located between the first electrode and the third electrode.

3. The semiconductor light-emitting device according to claim 1, wherein
   the optical waveguide is disposed so as to extend from the front edge surface to a rear edge surface of the stacked structure.

4. The semiconductor light-emitting device according to claim 1, wherein
   the curved waveguide portion perpendicularly reaches a rear edge surface of the stacked structure.

5. The semiconductor light-emitting device according to claim 1, wherein
   the curved waveguide portion is formed closer to a rear edge surface side of the stacked structure than the center of the optical waveguide.

6. The semiconductor light-emitting device according to claim 1, wherein
   a high-reflectance film in which a plurality of dielectric films are stacked is formed on a rear edge surface of the stacked structure.

7. The semiconductor light-emitting device according to claim 1, wherein
   an extremely-low-reflectance film as a single layer or multiple layers of dielectric films is formed on the front edge surface of the stacked structure.

8. A projector comprising:
   the semiconductor light-emitting device according to claim 1;
   a light modulation device modulating, according to image information, light emitted from the semiconductor light-emitting device; and
   a projection device projecting an image formed by the light modulation device.

9. A projector comprising:
   the semiconductor light-emitting device according to claim 2;
   a light modulation device modulating, according to image information, light emitted from the semiconductor light-emitting device; and
   a projection device projecting an image formed by the light modulation device.

10. A projector comprising:
    the semiconductor light-emitting device according to claim 3;
    a light modulation device modulating, according to image information, light emitted from the semiconductor light-emitting device; and
    a projection device projecting an image formed by the light modulation device.

11. A projector comprising:
    the semiconductor light-emitting device according to claim 4;
    a light modulation device modulating, according to image information, light emitted from the semiconductor light-emitting device; and
    a projection device projecting an image formed by the light modulation device.

12. A projector comprising:
    the semiconductor light-emitting device according to claim 5;
    a light modulation device modulating, according to image information, light emitted from the semiconductor light-emitting device; and
    a projection device projecting an image formed by the light modulation device.

13. A projector comprising:
    the semiconductor light-emitting device according to claim 6;
    a light modulation device modulating, according to image information, light emitted from the semiconductor light-emitting device; and
    a projection device projecting an image formed by the light modulation device.

14. A projector comprising:
the semiconductor light-emitting device according to claim 7;
a light modulation device modulating, according to image information, light emitted from the semiconductor light-emitting device; and
a projection device projecting an image formed by the light modulation device.

15. A super luminescent diode comprising:
a straight waveguide linearly extending from a light exiting portion; and
a curved waveguide continuous with the straight waveguide and having a shape with a curvature, wherein
the density of current injected into the straight waveguide is higher than that of current injected into the curved waveguide.

16. A projector comprising:
the super luminescent diode according to claim 15;
a light modulation device modulating, according to image information, light emitted from the super luminescent diode; and
a projection device projecting an image formed by the light modulation device.

* * * * *